(12) United States Patent
Hotelling et al.

(10) Patent No.: US 8,711,570 B2
(45) Date of Patent: Apr. 29, 2014

(54) FLEXIBLE CIRCUIT ROUTING

(75) Inventors: Steven Porter Hotelling, Los Gatos, CA (US); Joshua G. Wurzel, Sunnyvale, CA (US); Steven J. Martisauskas, San Francisco, CA (US); Thayne M. Miller, San Jose, CA (US); Kuo-Hua Sung, San Jose, CA (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 13/165,748

(22) Filed: Jun. 21, 2011

(65) Prior Publication Data

US 2012/0326990 A1    Dec. 27, 2012

(51) Int. Cl.
*H05K 1/00*    (2006.01)
*H05K 1/16*    (2006.01)

(52) U.S. Cl.
USPC ............ 361/749; 361/760; 174/254; 174/260

(58) Field of Classification Search
CPC .............................. H05K 1/118; H05K 1/0393
USPC .......................... 361/749, 760; 174/254, 260
See application file for complete search history.

(56) References Cited

U.S. PATENT DOCUMENTS

| | | | |
|---|---|---|---|
| 4,116,517 A * | 9/1978 | Selvin et al. ................. 439/67 |
| 4,687,695 A * | 8/1987 | Hamby ........................ 428/192 |
| 5,483,261 A | 1/1996 | Yasutake |
| 5,488,204 A | 1/1996 | Mead et al. |
| 5,670,994 A * | 9/1997 | Kawaguchi et al. .......... 345/206 |
| 5,737,053 A * | 4/1998 | Yomogihara et al. ......... 349/149 |
| 5,771,158 A * | 6/1998 | Yamagishi et al. ........... 361/777 |
| 5,825,352 A | 10/1998 | Bisset et al. |
| 5,835,079 A | 11/1998 | Shieh |
| 5,880,411 A | 3/1999 | Gillespie et al. |
| 5,920,309 A | 7/1999 | Bisset et al. |
| 6,061,246 A * | 5/2000 | Oh et al. ....................... 361/749 |
| 6,157,541 A * | 12/2000 | Hacke ........................... 361/749 |

(Continued)

FOREIGN PATENT DOCUMENTS

| | | |
|---|---|---|
| JP | 2000-163031 A | 6/2000 |
| JP | 2002-342033 A | 11/2002 |

(Continued)

OTHER PUBLICATIONS

European Search Report mailed Oct. 26, 2012, for EP Application No. 12170190.8, seven pages.

(Continued)

*Primary Examiner* — Jeremy Norris
*Assistant Examiner* — Nathan Milakovich
(74) *Attorney, Agent, or Firm* — Morrison & Foerster LLP (57) ABSTRACT

Flexible circuits for routing signals of a device, such as a touch sensor panel of a touch sensitive device, are provided. The flexible circuit can include a first set of traces for routing a first set of lines and a second set of traces for routing a second set of lines. The first set of traces can couple together the ends of at least a portion of the first set of lines. Additionally, the first set of traces can be non-intersecting or non-overlapping with the second set of traces. The flexible circuit can have a T-shape configuration and can be incorporated within a touch sensitive device, display device, printed circuit board, or the like. The flexible circuit can be placed over another flexible circuit, and can extend onto the device.

13 Claims, 8 Drawing Sheets

(56) References Cited

U.S. PATENT DOCUMENTS

| | | | |
|---|---|---|---|
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,471,415 B1* | 10/2002 | Poorman | 385/59 |
| 6,519,021 B1* | 2/2003 | Aruga | 349/152 |
| 6,690,387 B2 | 2/2004 | Zimmerman et al. | |
| 6,870,590 B2* | 3/2005 | Shoji | 349/152 |
| 6,952,870 B2* | 10/2005 | Miller | 29/832 |
| 7,015,894 B2 | 3/2006 | Morohoshi | |
| 7,095,476 B2* | 8/2006 | Lo et al. | 349/150 |
| 7,119,801 B1* | 10/2006 | Endo et al. | 345/204 |
| 7,184,064 B2 | 2/2007 | Zimmerman et al. | |
| 7,349,054 B2* | 3/2008 | Kohtaka | 349/150 |
| 7,432,451 B2* | 10/2008 | Yamada | 174/260 |
| 7,518,691 B2* | 4/2009 | Kobayashi et al. | 349/152 |
| 7,663,607 B2 | 2/2010 | Hotelling et al. | |
| 7,715,204 B2* | 5/2010 | Miller | 361/760 |
| 7,965,367 B2* | 6/2011 | Oohira | 349/150 |
| 8,026,903 B2 | 9/2011 | Hamblin et al. | |
| 8,031,150 B2* | 10/2011 | Kim et al. | 345/92 |
| 8,217,913 B2* | 7/2012 | Hotelling et al. | 345/173 |
| 8,217,924 B2* | 7/2012 | Kwak et al. | 345/204 |
| RE44,314 E* | 6/2013 | Mishima et al. | 349/149 |
| 8,479,122 B2 | 7/2013 | Hotelling et al. | |
| 8,493,345 B2* | 7/2013 | Anno | 345/173 |
| 8,564,550 B2* | 10/2013 | Hashimoto | 345/173 |
| 2002/0167494 A1 | 11/2002 | Sherman et al. | |
| 2005/0040504 A1* | 2/2005 | Kang et al. | 257/678 |
| 2006/0026521 A1 | 2/2006 | Hotelling et al. | |
| 2006/0197753 A1 | 9/2006 | Hotelling | |
| 2006/0256099 A1* | 11/2006 | Tashiro | 345/204 |
| 2006/0268213 A1* | 11/2006 | Kang et al. | 349/149 |
| 2007/0035473 A1* | 2/2007 | Yamazaki et al. | 345/4 |
| 2008/0006453 A1* | 1/2008 | Hotelling | 178/18.06 |
| 2008/0018849 A1* | 1/2008 | Igarashi | 349/149 |
| 2008/0074398 A1 | 3/2008 | Wright | |
| 2008/0074853 A1* | 3/2008 | Jang et al. | 361/749 |
| 2008/0158167 A1 | 7/2008 | Hotelling et al. | |
| 2008/0158181 A1 | 7/2008 | Hamblin et al. | |
| 2008/0158183 A1 | 7/2008 | Hotelling et al. | |
| 2008/0164056 A1* | 7/2008 | Gettemy et al. | 174/260 |
| 2008/0232047 A1* | 9/2008 | Yamada | 361/681 |
| 2008/0309633 A1 | 12/2008 | Hotelling et al. | |
| 2009/0135364 A1* | 5/2009 | Lee et al. | 349/149 |
| 2009/0207336 A1* | 8/2009 | Lee et al. | 349/58 |
| 2009/0266621 A1 | 10/2009 | Huang et al. | |
| 2009/0273570 A1* | 11/2009 | Degner et al. | 345/173 |
| 2009/0283300 A1* | 11/2009 | Grunthaner | 174/254 |
| 2009/0303189 A1* | 12/2009 | Grunthaner et al. | 345/173 |
| 2009/0314621 A1 | 12/2009 | Hotelling | |
| 2010/0059294 A1 | 3/2010 | Elias et al. | |
| 2010/0079387 A1* | 4/2010 | Rosenblatt et al. | 345/173 |
| 2010/0110040 A1 | 5/2010 | Kim et al. | |
| 2010/0149108 A1 | 6/2010 | Hotelling et al. | |
| 2010/0315399 A1 | 12/2010 | Jacobson et al. | |
| 2010/0321326 A1* | 12/2010 | Grunthaner et al. | 345/174 |
| 2011/0001706 A1 | 1/2011 | Sanford et al. | |
| 2011/0012845 A1 | 1/2011 | Rothkopf et al. | |
| 2011/0025660 A1* | 2/2011 | Song et al. | 345/206 |
| 2011/0050617 A1* | 3/2011 | Murphy et al. | 345/174 |
| 2011/0074705 A1* | 3/2011 | Yousefpor et al. | 345/173 |
| 2011/0094993 A1 | 4/2011 | Hamblin et al. | |
| 2011/0102729 A1* | 5/2011 | Kawamura et al. | 349/158 |
| 2011/0134075 A1* | 6/2011 | Takusa | 345/174 |
| 2011/0199738 A1* | 8/2011 | Moriwaki | 361/748 |
| 2011/0254758 A1* | 10/2011 | Lin et al. | 345/84 |
| 2011/0254830 A1* | 10/2011 | Chang et al. | 345/213 |
| 2011/0279400 A1* | 11/2011 | Yilmaz | 345/174 |
| 2011/0310054 A1* | 12/2011 | Souchkov | 345/174 |
| 2012/0057312 A1* | 3/2012 | Yoo et al. | 361/749 |
| 2012/0146022 A1* | 6/2012 | Hida et al. | 257/49 |
| 2012/0162090 A1* | 6/2012 | Chang et al. | 345/173 |
| 2012/0162584 A1* | 6/2012 | Chang et al. | 349/106 |
| 2013/0044443 A1* | 2/2013 | Yoshifusa | 361/749 |
| 2013/0141912 A1* | 6/2013 | Kim | 362/249.02 |
| 2013/0201620 A1* | 8/2013 | Schlaupitz et al. | 361/679.27 |

FOREIGN PATENT DOCUMENTS

| | | |
|---|---|---|
| TW | 200843220 A | 11/2008 |
| TW | 201023129 A | 6/2010 |
| WO | WO-2007/146785 A2 | 12/2007 |
| WO | WO-2007/146785 A3 | 12/2007 |
| WO | WO 2012077576 A1 * | 6/2012 |
| WO | WO-2012/177351 A1 | 12/2012 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rugine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

International Search Report mailed Aug. 31, 2012, for PCT Application No. PCT/US12/39072, filed May 23, 2012, three pages.

Schoening, J. et al. (Oct. 2008). "Multi-Touch Surfaces: A Technical Guide," Technical Report TUM-10833, Technical Reports of the Technical University of Munich, located at http://ar.in.tum.de/pub/schoening2008multitouch/schoening2008multitouch.pdf, last visited Aug. 9, 2012, 19 pages.

Schoening, J. et al. (Oct. 2008). "Multi-Touch Surfaces: A Technical Guide," Technical Report TUM-10833, Technical Reports of the Technical University of Munich, located at http://www.citeulike.org/group/7653/article/3431399, last visited Aug. 11, 2012, one page.

* cited by examiner

T-shaped FPC
201

FLEXIBLE CIRCUIT ROUTING

FIELD

This relates generally to flexible printed circuits (FPCs), and, more specifically, to routing signals using an FPC.

BACKGROUND

Many types of input devices are presently available for performing operations in a computing system, such as buttons or keys, mice, trackballs, joysticks, touch sensor panels, touch screens, and the like. Touch sensitive devices, such as touch screens, in particular, are becoming increasingly popular because of their ease and versatility of operation. A touch sensitive device can include a touch sensor panel, which can be a clear panel with a touch-sensitive surface, and a display device, such as a liquid crystal display (LCD), that can be positioned partially or fully behind the panel so that the touch-sensitive surface can cover at least a portion of the viewable area of the display device. The touch sensitive device can allow a user to perform various functions by touching the touch sensor panel using a finger, stylus, or other object at a location often dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

Some touch sensitive devices that incorporate touch sensor panels can include FPCs for routing signals indicative of a touch event to and from the touch sensor panel. Other devices, such as LCDs, organic light-emitting diode (OLED) displays, printed circuit boards, and the like, can also include FPCs for routing signals. While relatively small, the FPCs can still add to the size of the device and block critical areas that could otherwise be used for other device components, such as receivers, cameras, and the like. Thus, compact FPCs are desired.

SUMMARY

This relates to flexible circuits for routing signals within a device, for example, routing signals of a touch sensor panel of a touch sensitive device. The flexible circuit can include a first set of traces for routing a first set of lines (e.g., drive lines of the touch sensor panel to stimulate the panel) and a second set of traces for routing a second set of lines (e.g., sense lines of the touch sensor panel to sense a touch event). In some embodiments, the first set of traces can couple together the ends of at least a portion of the first set of lines (e.g., drive lines). Additionally, the first set of traces can be non-intersecting or non-overlapping with the second set of traces. In some embodiments, the flexible circuit can include two layers on which the first and second set of traces can be located. In some embodiments, the flexible circuit can have a T-shape configuration and can be incorporated within a touch sensitive device, display device, printed circuit board (PCB), or the like. The flexible circuit can be placed over another flexible circuit, and can extend onto the device, for example, onto a thin film transistor glass of a touch sensitive device. The flexible circuit can advantageously reduce the capacitive coupling between the first set of lines (e.g., drive lines) and the second set of lines (e.g., sense lines), reduce the impedance of the first set of lines (e.g., drive lines), and limit the size of the flexible circuit.

Processes for routing signals of a device, such as a touch sensitive device, display device, PCB, or the like, are also disclosed, including routing first and second sets of traces on a flexible circuit so that the traces are non-overlapping.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to flexible circuits for routing signals within a device, for example, routing signals of a touch sensor panel of a touch sensitive device. The flexible circuit can include a first set of traces for routing a first set of lines (e.g., drive lines of the touch sensor panel to stimulate the panel) and a second set of traces for routing a second set of lines (e.g., sense lines of the touch sensor panel to sense a touch event). The first set of traces can couple together the ends of at least a portion of the first set of lines (e.g., drive lines). Additionally, the first set of traces can be non-intersecting or non-overlapping with the second set of traces. In some embodiments, the flexible circuit can include two layers on which the first and second set of traces can be located. In some embodiments, the flexible circuit can have a T-shape configuration and can be incorporated within a touch sensitive device, display device, PCB, or the like. The flexible circuit can be included within a device, such as a touch sensitive device, display device, PCB, or the like, and placed over another flexible circuit. These will be described in more detail below. The flexible circuit can advantageously reduce the capacitive coupling between the first set of lines (e.g., drive lines) and the second set of lines (e.g., sense lines), reduce the impedance of the first set of lines (e.g., drive lines), and limit the size of the flexible circuit. Processes for routing signals of a device, such as a touch sensitive device, display device, PCB, or the like, are also disclosed.

While the flexible circuits are described herein as being used with a touch sensitive device, it should be appreciated that the flexible circuits can similarly be used with other devices, such as display devices, PCBs, and the like.

Figure 1:
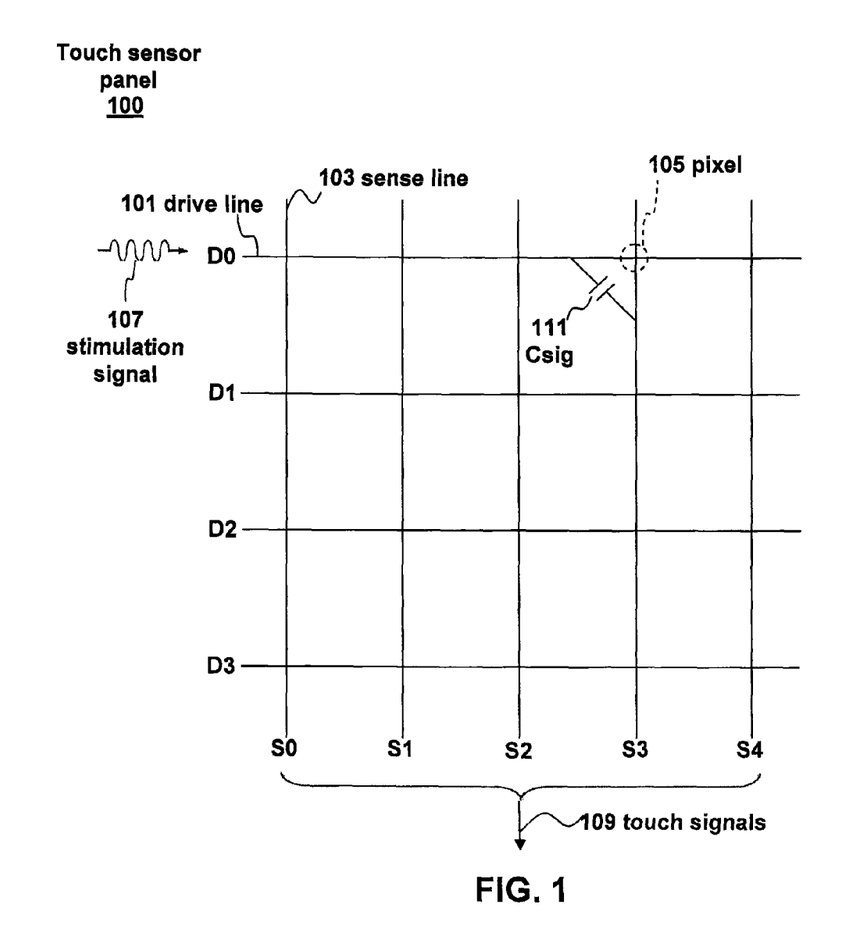
FIG. 1 illustrates an exemplary touch sensor panel according to various embodiments.

FIG. 1 illustrates a portion of an exemplary touch sensor panel 100 according to various embodiments. Touch sensor panel 100 can include an array of pixels 105 that can be formed at the crossing points between rows of drive lines 101 (D0-D3) and columns of sense lines 103 (S0-S4). Each pixel 105 can have an associated mutual capacitance Csig 111 formed between the crossing drive lines 101 and sense lines 103 when the drive lines are stimulated. The drive lines 101 can be stimulated by stimulation signals 107 provided by drive circuitry (not shown) and can include an alternating current (AC) waveform. The sense lines 103 can transmit touch or sense signals 109 indicative of a touch at the panel 100 to sense circuitry (not shown), which can include a sense amplifier for each sense line.

To sense a touch at the panel 100, drive lines 101 can be stimulated by the stimulation signals 107 to capacitively couple with the crossing sense lines 103, thereby forming a capacitive path for coupling charge from the drive lines 101 to the sense lines 103. The crossing sense lines 103 can output touch signals 109, representing the coupled charge or current. When a user's finger (or other object) touches the panel 100, the finger can cause the capacitance Csig 111 to reduce by an amount ΔCsig at the touch location. This capacitance change ΔCsig can be caused by charge or current from the stimulated drive line 101 being shunted through the touching finger to ground rather than being coupled to the crossing sense line 103 at the touch location. The touch signals 109 representative of the capacitance change ΔCsig can be transmitted by the sense lines 103 to the sense circuitry for processing. The touch signals 109 can indicate the pixel where the touch occurred and the amount of touch that occurred at that pixel location.

While the embodiment shown in FIG. 1 includes four drive lines 101 and five sense lines 103, it should be appreciated that touch sensor panel 100 can include any number of drive lines 101 and any number of sense lines 103 to form the desired number and pattern of pixels 105.

While various embodiments describe a sensed touch, it should be appreciated that the panel 100 can also sense a hovering object and generate hover signals therefrom.

In some embodiments, drive lines 101 can be dual gated, meaning that they can be driven from both sides of the row. In these embodiments, the ends of each row of drive line 101 can be coupled together to reduce the impedance of the drive lines 101 and to balance the panel. In some embodiments, as will be described in greater detail below, an FPC can be used to couple the ends of drive lines 101 together. Unlike drive lines 101, sense lines 103 may not be dual gated, and thus, the ends of sense lines 103 may not be coupled together.

In the embodiments having dual gated drive lines 101, it can be desirable to limit the length of drive lines 101 by coupling together the ends of each drive line using wires or traces having the shortest lengths possible. This can limit the impedance of each drive line, resulting in improved responses to touch events.

Additionally, when routing drive lines 101 and sense lines 103 within a device, it can be desirable to avoid intersecting or overlapping the wires or traces used to route sense lines 103 with the wires or traces used to route drive lines 101 outside of the active area (i.e., the pixel area) of the panel 100. For example, it can be desirable to avoid situations where the wires or traces for drive lines 101 pass above or below the wires or traces for sense lines 103 (but do not make direct electrical contact with each other) outside of the active area. This can be done to avoid creating unwanted capacitances between the wires or traces, which can result in additional "pixels" being formed in areas away from the active area of the panel 100. These unwanted pixels can generate false touch events and/or "negative touch events" on the panel 100, in some instances when the user touches the device near the additional pixels and in other instances when no touch is occurring.

Figure 2:
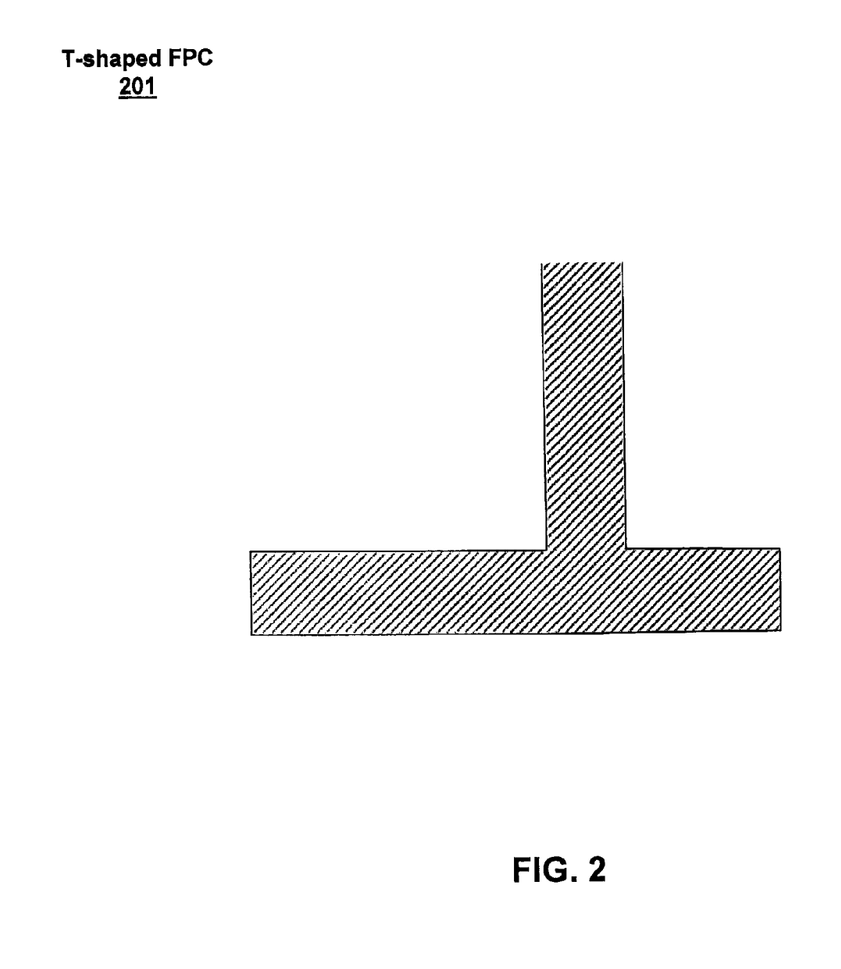
FIG. 2 illustrates a top view of an exemplary T-shaped FPC according to various embodiments.

To prevent the formation of unwanted pixels in this way, a T-shaped FPC according to various embodiments can be used to route drive lines and sense lines of a touch sensor panel. FIG. 2 illustrates an exemplary T-shaped FPC 201 that can be used to route drive lines and sense lines of a touch sensor panel that are similar or identical to drive lines 101 and sense lines 103 of touch sensor panel 100.

Figure 3:
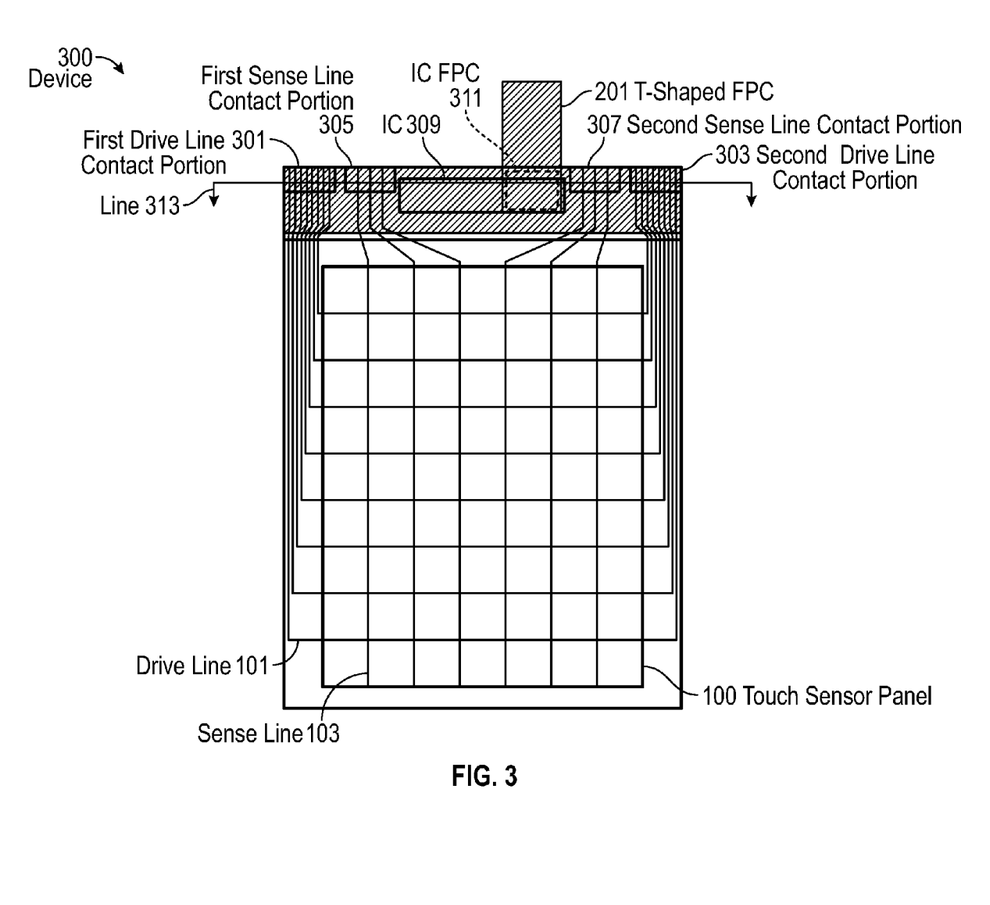
FIG. 3 illustrates a top view of an exemplary touch sensitive device having a T-shaped FPC according to various embodiments.

FIG. 3 illustrates a top-view of an exemplary device 300, such as a mobile phone, touchpad, portable computer, portable media player, or the like. Device 300 can include a touch sensor panel 100 for detecting touch events on the display of the device. In the example shown in FIG. 3, touch sensor panel 100 can include eight drive lines 101 and six sense lines 103. However, it should be appreciated that a touch sensor panel 100 having any number of drive lines 101 and sense lines 103 can be used.

In some embodiments, one end of the drive lines 101 can be routed along an edge of device 300 to a first drive line output pad or contact portion 301, while the other end of the drive lines 101 can be routed along an opposite edge of device 300 to a second drive line output pad or contact portion 303. The first drive line contact portion 301 and second drive line contact portion 303 can include exposed segments of each of the drive lines 101 and can be used by an external device or connector, such as a flat cable or FPC (also referred to herein as a "flex circuit"), to couple to each end of the drive lines 101.

In some embodiments, one end of a portion of the sense lines 103 can be routed to a first sense line output pad or contact portion 305, while the remaining sense lines 103 can be routed to a second sense line output pad or contact portion 307. Similar to the drive line contact portions 301 and 303, sense line contact portions 305 and 307 can include exposed segments of the sense lines 103 and can be used by an external device or connector, such as a flat cable or FPC, to couple to an end of the sense lines 103. While the example shown in FIG. 3 includes three sense lines 103 routed to first sense line contact portion 305 and three sense lines 103 routed to the second sense line contact portion 307, it should be appreciated that any number of sense lines 103 can be routed to any number of sense line contact portions. For example, in some embodiments, device 300 can include ten sense lines with all ten sense lines 103 being routed to a single sense line contact portion, while in other embodiments, device 300 can include nine sense lines with three sense lines being routed to each of three sense line contact portions.

Device 300 can further include an integrated circuit (IC) 309 for performing processing functions relating to device 300. For example, in some embodiments, IC 309 can be used to control the display of device 300. The drive lines 101 and sense lines 103 can be routed around IC 309 to contact portions 301, 303, 305, and 307. In other embodiments, contact portions 301, 303, 305, and 307 can be located in different areas of device 300 depending on the location of IC 309, with the drive lines 101 and sense lines 103 being appropriately routed around IC 309 to their corresponding contact portions.

Device 300 can further include IC FPC 311 (shown in FIG. 3 as the grey strip connected to IC 309 and beneath T-shaped FPC 201) for coupling IC 309 to other components within device 300. For example, IC FPC 311 can couple IC 309 to a printed circuit board located within device 300. In some embodiments, IC FPC 311 can have a width that is smaller than the width of IC 309, thereby allowing a more compact design of device 300.

Device 300 can further include T-shaped FPC 201 for routing drive lines 101 and sense lines 103 of touch sensor panel 100. T-shaped FPC 201 can include traces for coupling together the ends of drive lines 101 without intersecting or overlapping with traces coupled to sense lines 103. As shown in FIG. 3, T-shaped FPC 201 can be attached to device 300 such that the crossbar of T-shaped FPC 201 extends beyond the contact portions 301, 303, 305, and 307 towards touch sensor panel 100. As will be discussed in greater detail below, this can allow the traces for drive lines 101 and the traces for sense lines 103 to be routed down towards touch sensor panel 100 before being routed through the neck of T-shaped FPC 201. This FPC design can avoid intersections between traces for drive lines 101 and sense lines 103 within the FPC. In some embodiments, since the traces of T-shaped FPC 201 can be routed over conductive material formed on the thin film transistor (TFT) glass of device 300 located beyond the contact portions 301, 303, 305, and 307 toward touch sensor panel 100, an insulating material can be placed between the glass of device 300 and T-shaped FPC 201 to reduce or prevent electrical shorts between the conductive material formed on the glass of device 300 and T-shaped FPC 201.

Figure 4:
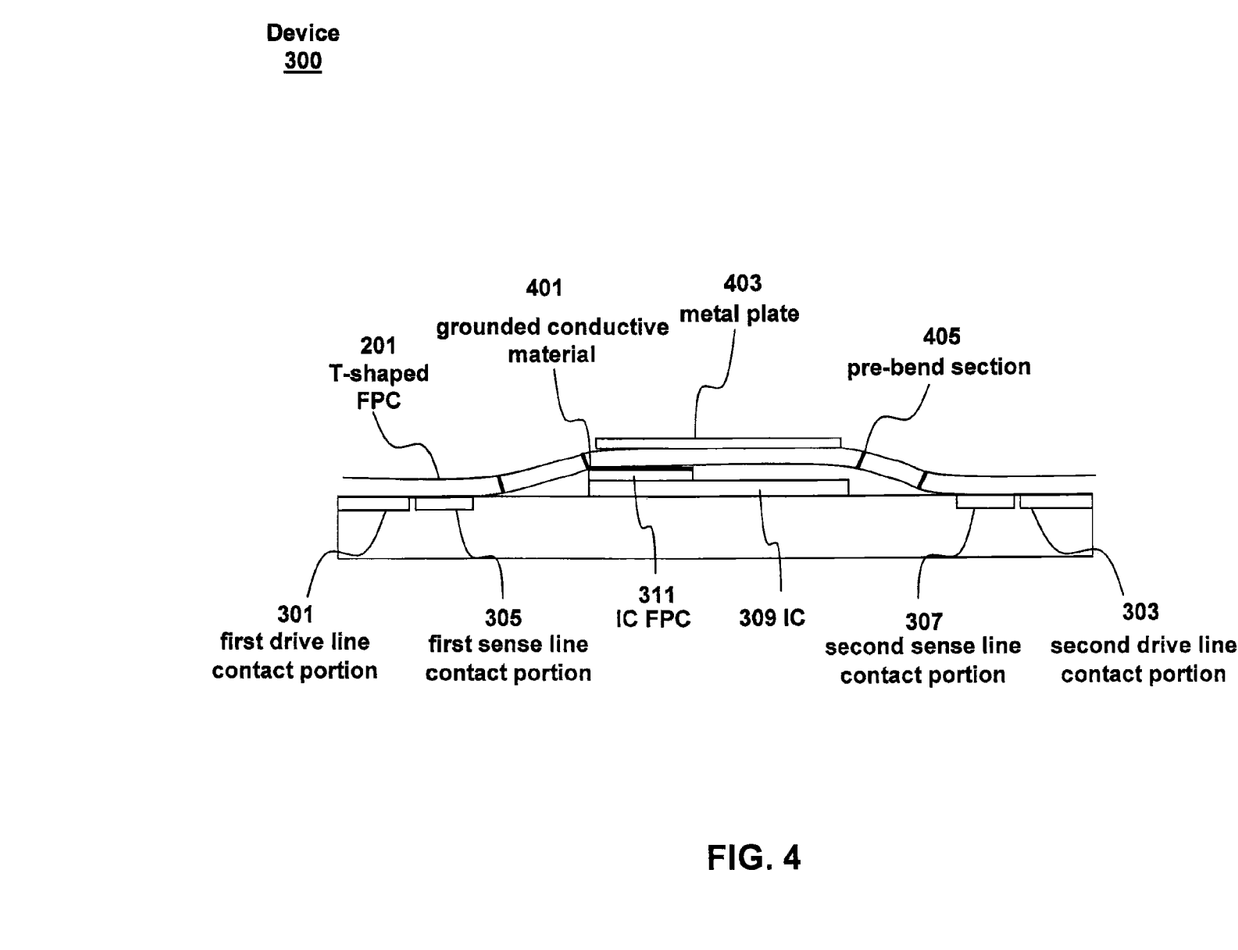
FIG. 4 illustrates a cross-sectional view of an exemplary touch sensitive device having a T-shaped FPC according to various embodiments.

In some embodiments, T-shaped FPC 201 can be placed at least partially on IC FPC 311. To illustrate, FIG. 4 shows a cross-sectional view of device 300 cut along line 313. As shown in FIG. 4, T-shaped FPC 201 can be placed above IC FPC 311 and IC 309. In this way, T-shaped FPC 201 can couple to drive lines 101 and sense lines 103 at contact portions 301, 303, 305, and 307, without interfering with the coupling between IC 309 and IC FPC 311.

In some embodiments, device 300 can include a grounded conductive material 401 placed between IC FPC 311 and T-shaped FPC 201 to reduce noise in T-shaped FPC 201 caused by the high frequency signals transmitted through IC FPC 311. Grounded conductive material 401 can include a film of conductive material, such as silver or another metal.

In some embodiments, device 300 can further include stiffener 403 positioned on T-shaped FPC 201 above IC FPC 311 and IC 309. Stiffener 403 can be used to limit the height of T-shaped FPC 201 by reducing the amount of bowing that can occur due to misalignment of the FPC on device 300. For example, misalignment of T-shaped FPC 201 in the lateral direction can cause an increase in height of T-shaped FPC 201. This can be undesirable since this can add to the thickness of device 300 or can cause pressure on an object, such as a touch panel or cover glass, placed above T-shaped FPC 201. Stiffener 403 can be used to flatten T-shaped FPC 201 and reduce the effects of the lateral misalignment of the FPC. Stiffener 403 can include any rigid material, such as polyimide (PI), stainless steel, copper, silver, or the like. In some embodiments, stiffener 403 can include a metal plate coupled to ground.

In some embodiments, T-shaped FPC 201 can include pre-bend sections 405 to further reduce the amount of bowing caused by misalignment of the FPC. Pre-bend sections 405 can include portions of T-shaped FPC 201 that are intentionally weakened in order to make the FPC more likely to bend at these locations. Pre-bend sections 405 can be positioned on portions of T-shaped FPC 201 to cause the FPC to conform to the shape of IC FPC 311 and IC 309 (or any other object positioned below T-shaped FPC 201). Additionally, pre-bend sections 405 can allow each end of T-shaped FPC 201 to be independently positioned during bonding, thereby preventing manufacturing tolerances from making one side of the bond successful while forcing the other to be misaligned.

Figure 5:
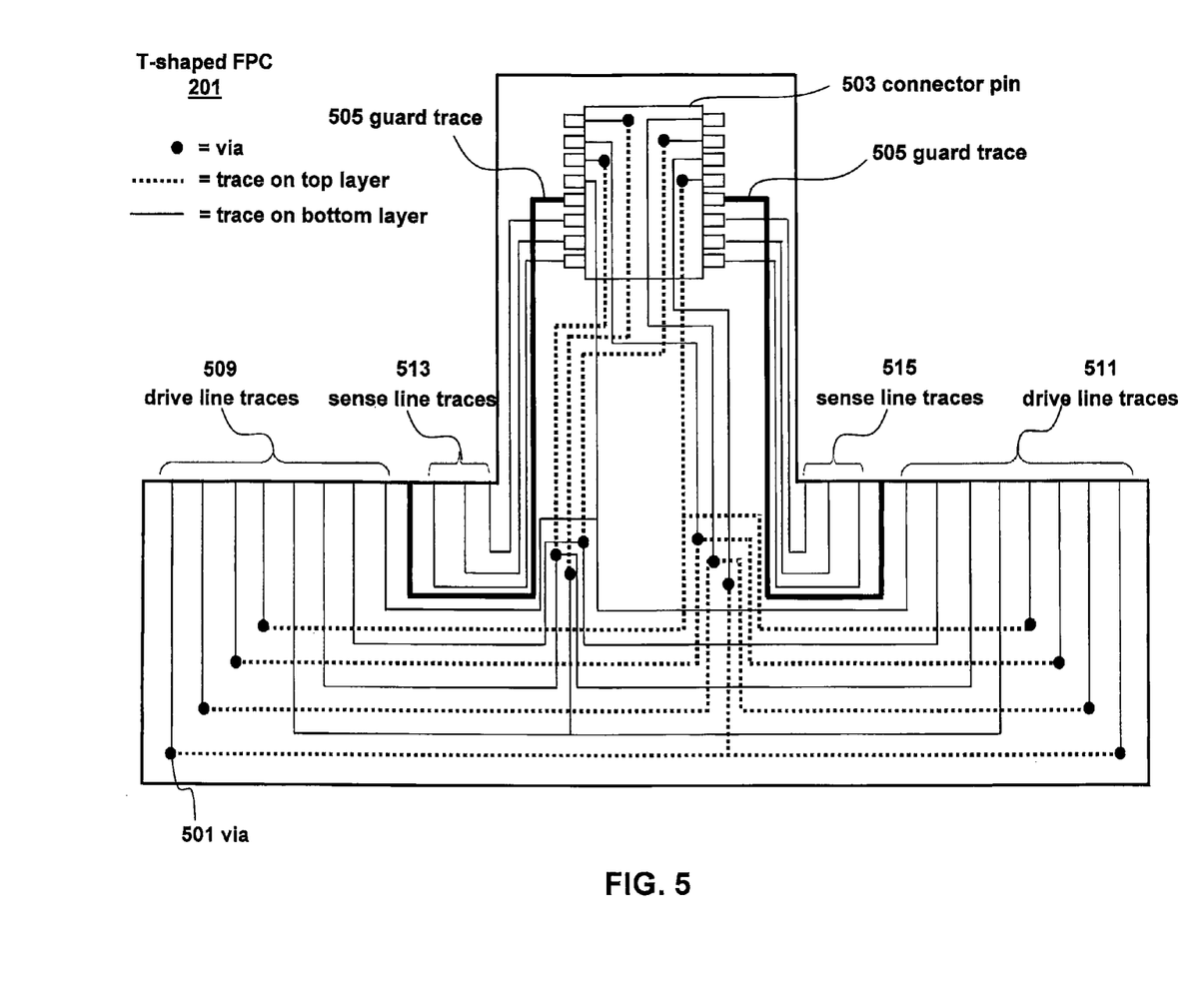
FIG. 5 illustrates a top view of an exemplary T-shaped FPC according to various embodiments.

FIG. 5 illustrates a more detailed view of T-shaped FPC 201 showing the traces for routing drive lines 101 and sense lines 103 of device 300 to an output of the FPC. In the illustrated example, the drive lines 101 and sense lines 103 are being routed to a connector pin 503 of, for example, a printed circuit board coupled to the output of T-shaped FPC 201. The output of T-shaped FPC 201 can include exposed traces, connector pins, or any other appropriate coupling device. In some embodiments, T-shaped FPC 201 can include two layers of traces with vias 501 for routing the traces between the layers. In FIG. 5, the un-bolded solid lines represent traces located on the bottom layer of T-shaped FPC 201, the dotted lines represent traces located on the top layer of T-shaped FPC 201, and the large dots represent vias 501 connecting the bottom layer to the top layer.

In some embodiments, T-shaped FPC 201 can include drive line traces 509 for routing drive lines 101 from first drive line contact portion 301, drive line traces 511 for routing drive lines 101 from second drive line contact portion 303, sense line traces 513 for routing sense lines 103 from first sense line contact portion 305, and sense line traces 515 for routing sense lines 103 from second sense line contact portion 307. Thus, in these embodiments, T-shaped FPC 201 can include contact portions on the bottom side of the FPC to allow the traces 509, 511, 513, and 515 to couple to the exposed segments of drive lines 101 and sense lines 103 at contact portions 301, 303, 305, and 307 of device 300.

As shown in FIG. 5, sense line traces 513 and 515 can be routed to connector pin 503 through the bottom layer and along the outer portion of the neck of T-shaped FPC 201. Routing the sense line traces 513 and 515 in this way can leave open a channel at the crossbar portion of T-shaped FPC 201 (bottom of FIG. 5) through which the drive line traces 509 and 511 can couple together the drive lines 101 from first drive line contact portion 301 and second drive line contact portion 303. Additionally, a channel can be left open at the center of T-shaped FPC 201 through which the coupled drive line traces 509/511 can be routed to connector pin 503.

In some embodiments, as shown in FIG. 5, a portion of the drive line traces 509 and 511 (e.g., half of the drive line traces 509 and 511) located at the outer ends of T-shaped FPC 201 (left and right sides of FIG. 5) can be routed towards the touch sensor panel 100 of device 300 (bottom of FIG. 5) where they can be routed up to the top layer of T-shaped FPC 201 through vias 501. From there, the outer drive line traces 509 and 511 can be routed together towards the center of T-shaped FPC 201 where all but one pair of drive line traces 509 and 511 can be coupled together by a second set of vias 501. In the embodiment shown in FIG. 5, the vias 501 coupling together the outer drive line traces 509 and 511 can be arranged in a linear fashion. However, in other embodiments, the vias 501 can be arranged in a staggered fashion, as illustrated by the vias 501 located at the left-middle portion of FIG. 5. The combined outer drive line traces 509/511 from the second set of vias 501 can then be routed through the bottom layer at the center of T-shaped FPC 201 to connector pin 503, while the remaining pair of drive line traces 509 and 511 can be coupled together near the second set of vias 501 and routed through the top layer at the center of T-shaped FPC 201 to connector pin 503 where they can be routed to the bottom layer through a via 501 and coupled to connector pin 503. While all but one pair of outer drive line traces 509 and 511 are shown as being coupled together by the second set of vias 501, in some embodiments, all pairs of outer drive line traces 509 and 511 can be coupled together by vias 501 at the second set of vias 501 in a manner similar to that shown in FIG. 5.

In some embodiments, the remaining drive line traces 509 and 511 (e.g., the remaining half of drive line traces 509 and 511) located at the inner portion of T-shaped FPC 201 can be routed towards the touch sensor panel 100 of device 300 (bottom of FIG. 5). From there, the inner drive line traces 509 and 511 can be routed towards the center of T-shaped FPC 201 through the bottom layer where all but one pair of drive line traces 509 and 511 can be coupled together by a third set of vias 501. In the embodiment shown in FIG. 5, the vias 501 coupling together the inner drive line traces 509 and 511 can be arranged in a staggered fashion. However, in other embodiments, the vias 501 can be arranged in a linear fashion, as illustrated by the vias 501 located at the right-middle middle portion of FIG. 5. The combined inner drive line traces 509/511 from the third set of vias 501 can then be routed through the top layer at the center of T-shaped FPC 201 towards connector pin 503, where the combined inner drive line traces 509/511 can then be routed down to the bottom layer of T-shaped FPC 201 through another set of vias 501. The remaining pair of drive line traces 509 and 511 can be coupled together near the third set of vias 501 and routed through the bottom layer at the center of T-shaped FPC 201 to couple to connector pin 503. While all but one pair of inner drive line traces 509 and 511 are shown as being coupled together by the third set of vias 501, in some embodiments, all pairs of inner drive line traces 509 and 511 can be coupled together by vias 501 at the third set of vias 501 in a manner similar to that shown in FIG. 5.

As illustrated by FIG. 5, drive lines 101 and sense lines 103 can be coupled to connector pin 503 using T-shaped FPC 201 without the traces for drive lines 101 and sense lines 103 intersecting or overlapping. For example, drive line traces 509 and 511 may not cross paths with sense line traces 513 or 515 on the same or different layer of T-shaped FPC 201. This can reduce or prevent the formation of unwanted parasitic capacitance between drive line traces 509 and 511 and sense line traces 513 or 515 that can result in false touch events and/or negative touch events due to the formation of additional pixels away from the active area of the panel 100. While drive line traces 509 or 511 may overlap with other drive line traces 509 or 511, the formation of parasitic capacitance between drive line traces 509 or 511 may not result in the formation of additional pixels away from the active area of the panel 100 in the same way. Additionally, the ends of drive lines 101 can be coupled together by drive line traces 509 and 511 using relatively short trace lengths, thereby reducing the overall impedance of the drive lines 101.

In some embodiments, T-shaped FPC 201 can further include guard traces 505 positioned between the drive line traces and sense line traces for reducing the capacitances between the sense line traces 513 and drive line traces 509, and between sense line traces 515 and drive line traces 511. In some embodiments, guard traces 505 can be coupled to ground and can include a conductive material, such as silver or other metal.

While T-shaped FPC 201 was described above as having traces for eight drive lines 101 and six sense lines 103, it should be appreciated that the configuration shown in FIG. 5 can be extended to any number of drive lines 101 and sense lines 103. For instance, any number of sense line traces 513 and 515 can be routed along the outer edge of T-shaped FPC 201 to allow coupling between any number of drive line traces 509 and 511 and to allow the coupled drive line traces 509/511 to be routed through the center of the T-shaped FPC 201 to connector pin 503. Additionally, the outer drive line traces 509 and 511 can be coupled together on one of the layers (e.g., the top layer) of T-shaped FPC 201, while the remaining inner drive line traces 509 and 511 can be coupled together on the other layer (e.g., the bottom layer) of T-shaped FPC 201. The coupled inner and outer drive line traces 509/511 can then be routed to the opposite layer through a set of vias 501 arranged in either a staggered fashion or a linear fashion. From there, the drive lines 501 can be routed towards connector pin 503 where they can be routed to the bottom layer of T-shaped FPC 201 and coupled to the corresponding pins of connector pin 503.

Figure 6:
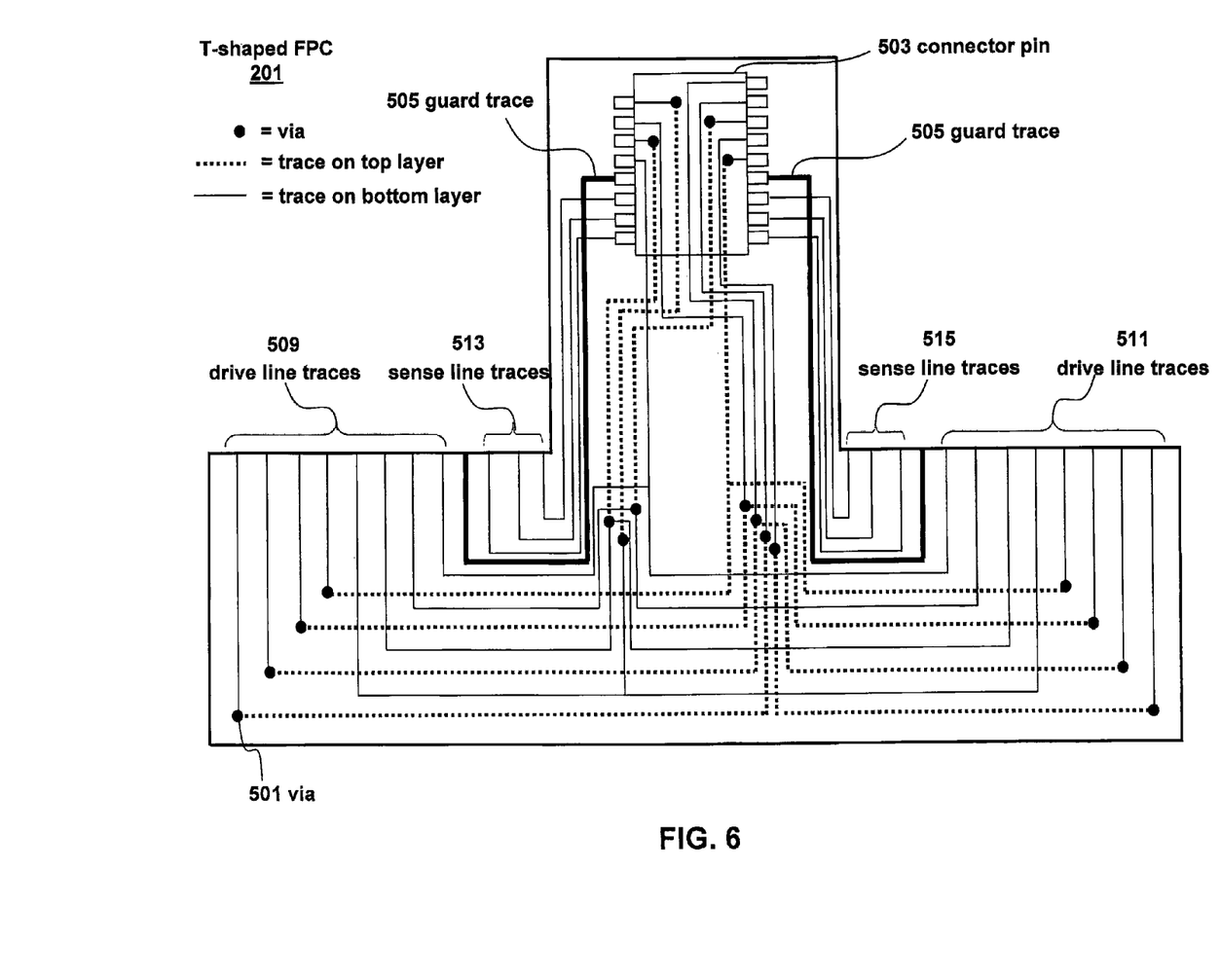
FIG. 6 illustrates a top view of another exemplary T-shaped FPC according to various embodiments.

FIG. 6 illustrates another embodiment of T-shaped FPC 201 in which one or more pairs (e.g., the outermost drive line traces 509 and 511 corresponding to the bottom drive line 101 row of panel 100) of drive line traces 509 and 511 may not be coupled together, thereby leaving a corresponding row of drive lines 101 uncoupled within T-shaped FPC 201. This can be done to allow measurement of the impedance of the one or more uncoupled drive lines 101 for quality control purposes. For example, if the measured impedance is high, this can indicate that the touch response of touch sensor panel 100 may be poor, while a low impedance can indicate that an electrical short may be present in the device. While problems associated with other drive lines 101 may not be detected by measuring the impedance of the one or more uncoupled drive lines 101, the one or more uncoupled drive lines 101 can provide a way to quickly compare touch sensor panels 100 that would not otherwise be available.

In some embodiments, the one or more uncoupled drive lines 101 can be coupled together in a location other than in the T-shaped FPC 201. For example, the ends of the one or more uncoupled drive lines 101 can be coupled together on a printed circuit board coupled to the output end of T-shaped FPC 201.

Figure 7:
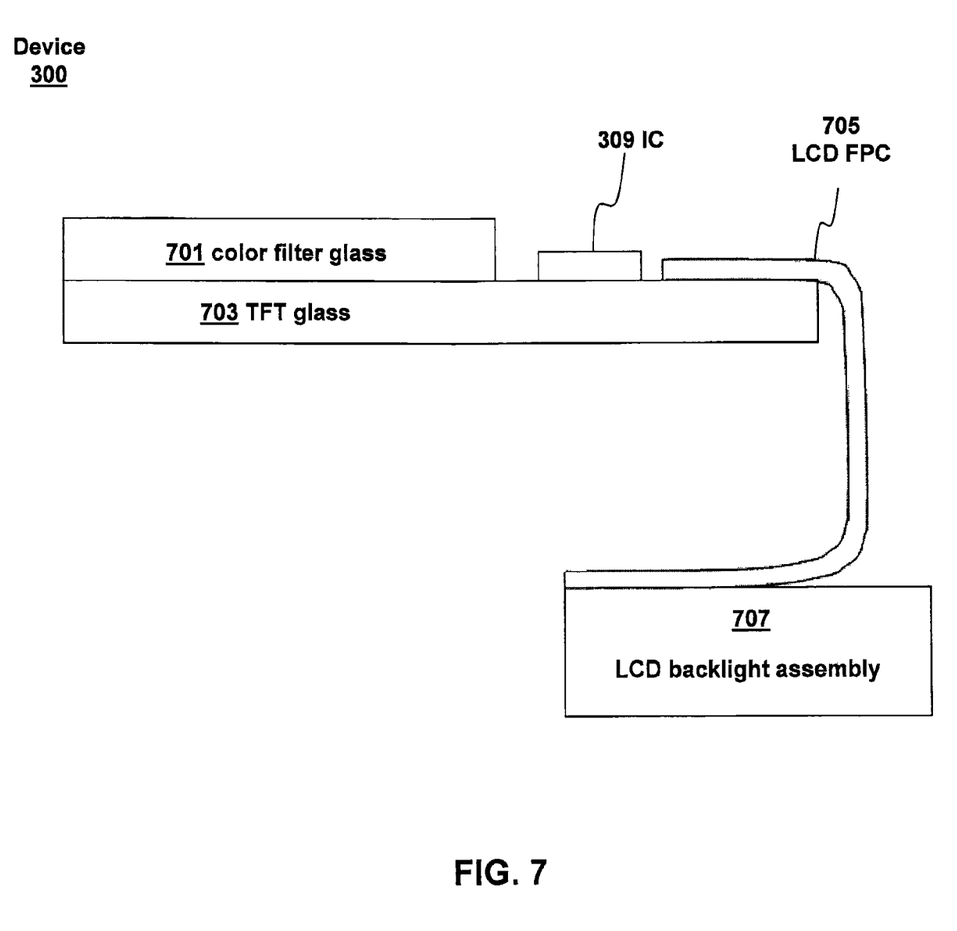
FIG. 7 illustrates a cross-sectional view of an exemplary touch sensitive device having a T-shaped FPC according to various embodiments.

FIG. 7 shows another exemplary embodiment of device 300 in which T-shaped FPC 201 can be incorporated into the LCD FPC 705. LCD FPC 705 can be coupled to the TFT glass 703 of device 300 and LCD backlight assembly 707. In these embodiments, LCD FPC 705 can include the already existing traces used for the LCD display, as well as the components of T-shaped FPC 201 with the exemplary trace routing described above. By incorporating the architecture of T-shaped FPC 201 into LCD FPC 705, the number of FPCs used in device 300 can be reduced.

Figure 8:
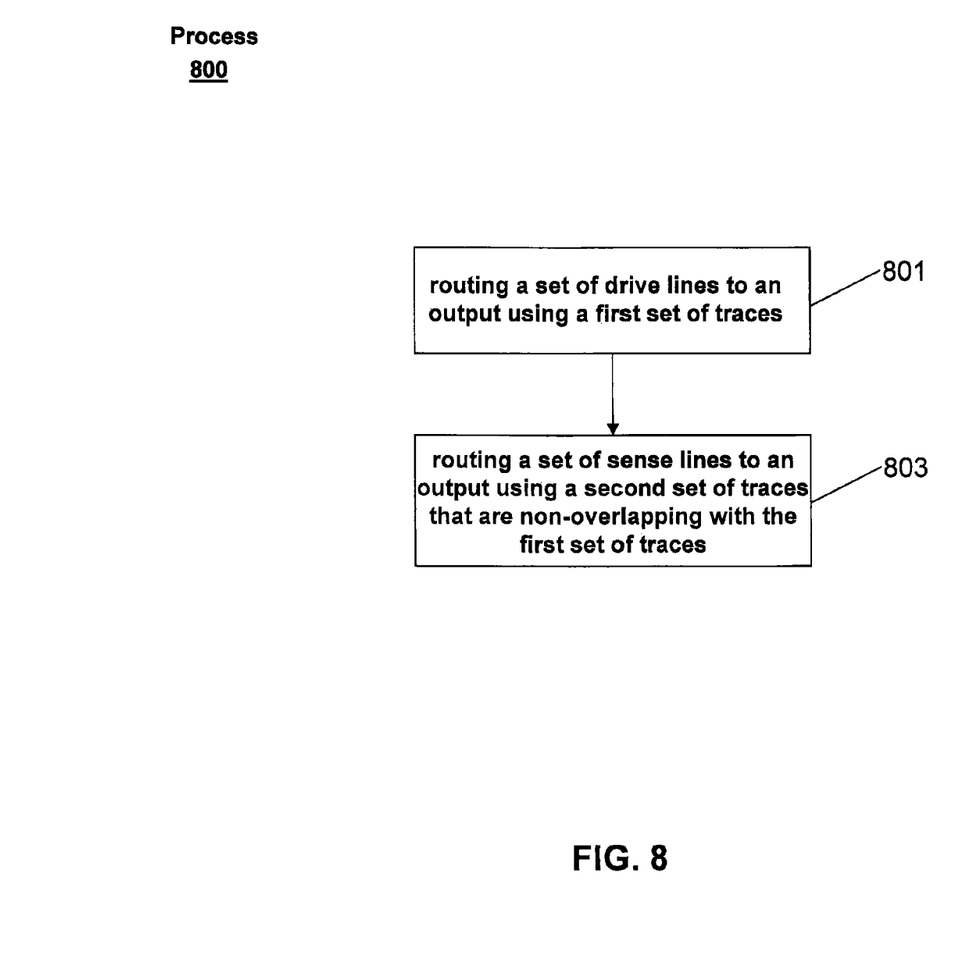
FIG. 8 illustrates an exemplary process for routing drive lines and sense lines of a touch sensor panel according to various embodiments.

FIG. 8 shows an exemplary process 800 for routing rows of drive lines and columns of sense lines. At block 801 of process 800, a set of drive lines can be routed to an output using a first set of traces. The drive lines can be part of a touch sensor panel and can be operable to receive an AC stimulation signal for detecting touch events on the panel. For example, the drive lines can be similar or identical to drive lines 101 of touch sensor panel 100.

In some embodiments, the first set of traces can be included within a T-shaped FPC that is similar or identical to T-shaped FPC 201. Additionally, in some embodiments, the ends of the drive lines can be coupled together by the first set of traces before reaching the output. For example, the drive lines can be coupled together by a first set of traces that is similar or identical to drive line traces 509 and 511.

At block 803, a set of sense lines can be routed to an output using a second set of traces. The sense lines can be part of a touch sensor panel and can intersect or overlap with the drive lines to form pixels within the touch sensor panel. The sense lines can further be operable to transmit touch or sense signals indicative of a touch event occurring on the panel. For example, the sense lines can be similar or identical to sense lines 103 of touch sensor panel 100.

In some embodiments, the second set of traces can be included within a T-shaped FPC that is similar or identical to T-shaped FPC 201. In some embodiments, the sense lines can be routed to the output without overlapping or intersecting with the first set of traces used to route the drive lines. For example, the sense lines can be routed by a second set of traces that is similar or identical to sense line traces 513 and 515.

A T-shaped FPC as described above with respect to in FIGS. 2-8 can be incorporated into a mobile phone, a digital media player, a portable computer, touch pad, display device, PCB, and other suitable devices.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A flex circuit comprising:
    a first line contact portion operable to couple to a first end of a first set of lines;
    a second line contact portion operable to couple to a second end of the first set of lines;
    a third line contact portion operable to couple to a second set of lines;
    a first output portion;
    a first set of traces coupling together the first line contact portion, the second line contact portion, and the output portion; and
    a second set of traces coupling together the third line contact portion and the output portion, wherein the first set of traces and second set of traces are non-overlapping with each other.

2. The flex circuit of claim 1, wherein the first set of lines comprises a set of drive lines of a touch sensitive display, and wherein the second set of lines comprises a set of sense lines of the touch sensitive display.

3. The flex circuit of claim 1, wherein the first set of traces is operable to couple the first end of at least a portion of the first set of lines to the second end of each corresponding line.

4. The flex circuit of claim 1, wherein the first set of traces create an open circuit between the first end of at least one line of the first set of lines and the second end of the at least one line.

5. The flex circuit of claim 1, wherein the flex circuit comprises a first layer and a second layer.

6. The flex circuit of claim 5, wherein the second set of traces is routed through the first layer, and wherein the first set of traces is routed through the first layer and the second layer.

7. The flex circuit of claim 1 incorporated into at least one of a mobile telephone, a digital media player, an LCD, an OLED display, or a personal computer.

8. A device including the flex circuit of claim 1, wherein the flex circuit is a second flex circuit attached to a distal end of a substrate, the device further comprising:
    a first flex circuit attached to the distal end of the substrate, wherein the second flex circuit overlaps the first flex circuit.

9. The device of claim 8, wherein the first flex circuit is coupled to an integrated circuit at the distal end of the substrate.

10. The device of claim 8, further comprising a grounded silver film disposed between the first flex circuit and the second flex circuit.

11. The device of claim 8, wherein the second flex circuit comprises at least one pre-bend section operable to reduce a distance between the second flex circuit and the first flex circuit.

12. The device of claim 8, further comprising a stiffener disposed on the second flex circuit, the stiffener operable to limit a distance between the second flex circuit and the first flex circuit, wherein the stiffener comprises a grounded metal plate or polyimide film.

13. The device of claim 8, wherein the second flex circuit is in a T-shape configuration.

* * * * *